United States Patent
Sueyama et al.

(10) Patent No.: US 11,456,250 B2
(45) Date of Patent: Sep. 27, 2022

(54) SEMICONDUCTOR DEVICE

(71) Applicant: Kioxia Corporation, Minato-ku (JP)

(72) Inventors: Takao Sueyama, Yokohama (JP); Yosuke Komori, Yokohama (JP)

(73) Assignee: Kioxia Corporation, Minato-ku (JP)

( * ) Notice: Subject to any disclaimer, the term of this patent is extended or adjusted under 35 U.S.C. 154(b) by 44 days.

(21) Appl. No.: 17/001,933

(22) Filed: Aug. 25, 2020

(65) Prior Publication Data

US 2021/0280508 A1 Sep. 9, 2021

(30) Foreign Application Priority Data

Mar. 3, 2020 (JP) .............................. JP2020-035964

(51) Int. Cl.
*H01L 23/48* (2006.01)
*H01L 23/528* (2006.01)
*H01L 27/088* (2006.01)
*H01L 23/532* (2006.01)

(52) U.S. Cl.
CPC ...... *H01L 23/528* (2013.01); *H01L 23/53228* (2013.01); *H01L 27/088* (2013.01)

(58) Field of Classification Search
CPC ... H01L 23/482; H01L 23/522; H01L 23/528; H01L 23/532; H01L 23/53228; H01L 27/088; H01L 29/417; H01L 29/41758; H01L 29/78; H01L 29/423; H01L 23/00; H01L 23/48; H01L 23/481; H01L 23/535; H01L 23/538; H01L 23/4824; H01L 23/5384; H01L 23/53238

USPC .......................................................... 257/762
See application file for complete search history.

(56) References Cited

U.S. PATENT DOCUMENTS

| 9,293,457 | B2 | 3/2016 | Tsuchiya et al. |
| 2011/0227182 | A1* | 9/2011 | Aoki ................. H01L 27/14683 257/435 |
| 2019/0131303 | A1 | 5/2019 | Yoshitani |
| 2020/0365514 | A1* | 11/2020 | Yang .................. H01L 23/5386 |

FOREIGN PATENT DOCUMENTS

| JP | 2016-21530 A | 2/2016 |
| WO | WO 2018/003001 A1 | 1/2018 |

\* cited by examiner

*Primary Examiner* — Chuong A Luu
(74) *Attorney, Agent, or Firm* — Oblon, McClelland, Maier & Neustadt, L.L.P.

(57) ABSTRACT

A semiconductor device according to the present embodiment comprises a first metallic line. The first metallic line is provided above a substrate and extends in a first direction with a first width. At least one second metallic line is connected to the first metallic line and extends in a second direction from the first metallic line with a second width that is smaller than the first width. A dummy metallic line is arranged adjacently to the at least one second metallic line, connected to the first metallic line, and extends in the second direction from the first metallic line. The dummy metallic line is not electrically connected to lines other than the first metallic line.

20 Claims, 5 Drawing Sheets

SEMICONDUCTOR DEVICE

CROSS REFERENCE TO RELATED APPLICATIONS

This application is based upon and claims the benefit of priority from the prior Japanese Patent Application No. 2020-035964, filed on Mar. 3, 2020, the entire contents of which are incorporated herein by reference.

FIELD

The embodiments of the present invention relate to a semiconductor device.

BACKGROUND

There are minute vacancies in metallic materials such as copper. These vacancies are locally concentrated due to application of stress and grow to relatively large voids. These voids increase the wiring resistance or cause breaking of lines.

DETAILED DESCRIPTION

Figure 1:
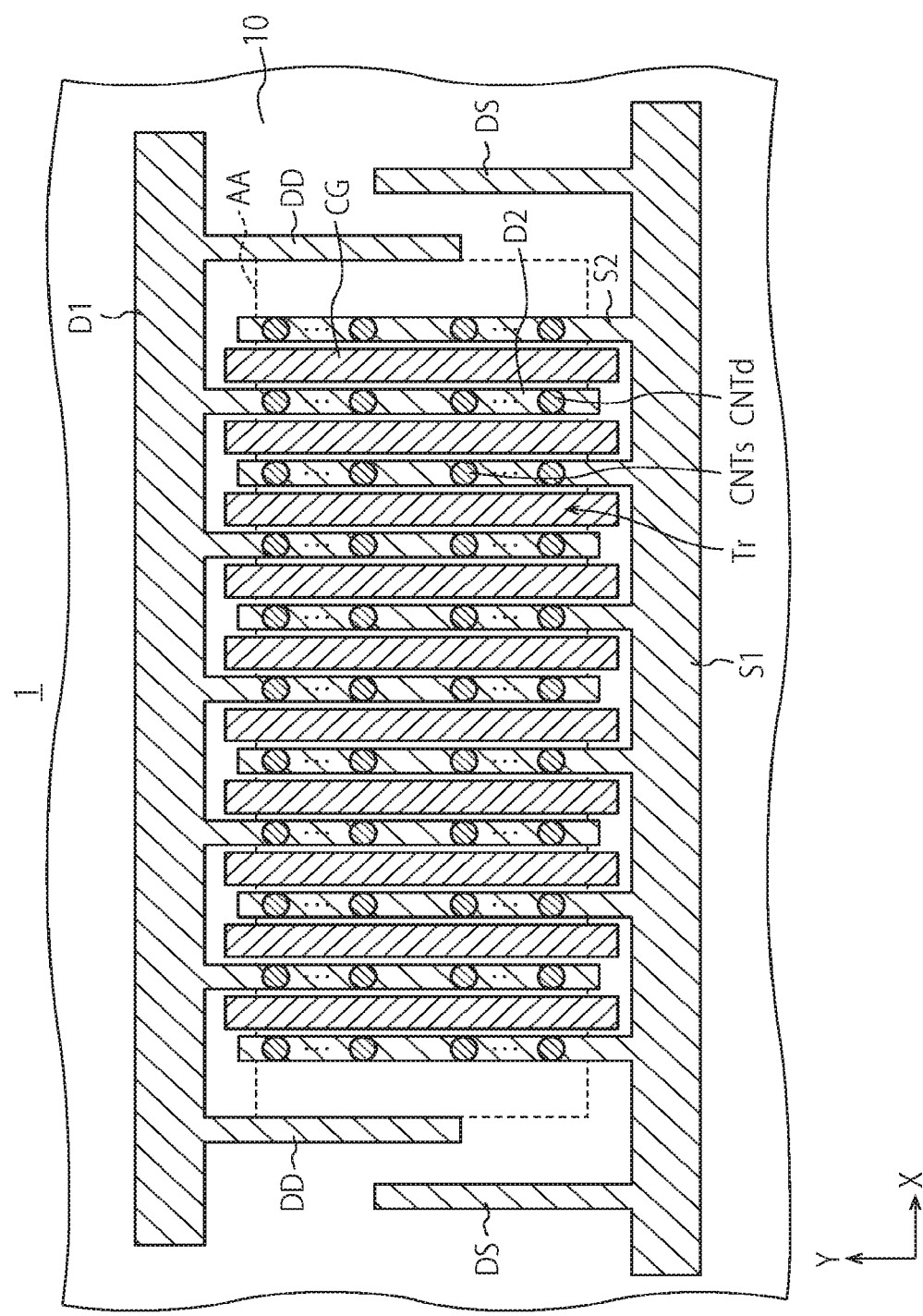
FIG. 1 is a plan view illustrating a configuration example of a semiconductor device according to a first embodiment.

Embodiments will now be explained with reference to the accompanying drawings. The present invention is not limited to the embodiments. In the present specification and the drawings, elements identical to those described in the foregoing drawings are denoted by like reference characters and detailed explanations thereof are omitted as appropriate.

A semiconductor device according to the present embodiment comprises a first metallic line. The first metallic line is provided above a substrate and extends in a first direction with a first width. At least one second metallic line is connected to the first metallic line and extends in a second direction from the first metallic line with a second width that is smaller than the first width. A dummy metallic line is arranged adjacently to the at least one second metallic line, connected to the first metallic line, and extends in the second direction from the first metallic line. The dummy metallic line is not electrically connected to lines other than the first metallic line.

First Embodiment

FIG. 1 is a plan view illustrating a configuration example of a semiconductor device according to a first embodiment. A semiconductor device 1 includes a semiconductor substrate 10, first source lines S1, first drain lines D1, second source lines S2, second drain lines D2, gate electrodes CG, dummy source lines DS, and dummy drain lines DD.

An active area AA is formed in a surface region of the semiconductor substrate 10. The active area AA is defined by formation of an element isolation region (not illustrated) therearound. A plurality of transistors Tr are provided on the semiconductor substrate 10 in the active area AA. The present embodiment can be applied to any semiconductor element having lines equivalent to the source lines S1 and S2 or the drain lines D1 and D2, other than transistors.

Each of the transistors Tr includes a source layer, a drain layer, and a gate electrode. Although not illustrated, the source layer and the drain layer are impurity diffused layers formed in the active area AA. In a case in which the transistors Tr are P-type MOSFETs (Metal Oxide Semiconductor Field Effect Transistors), the source layer and the drain layer are P-type impurity diffused layers. In a case in which the transistors Tr are N-type MOSFETs, the source layer and the drain layers are N-type impurity diffused layers.

As illustrated in FIG. 1, the first source lines S1 are located above the semiconductor substrate 10 and extend in an X-direction. A plurality of the second source lines S2 are connected to each of the first source lines S1 and extend in a Y-direction from the relevant first source line S1. The X-direction and the Y-direction are directions intersecting with each other on the surface of the semiconductor substrate 10 and are, for example, orthogonal directions. The second source lines S2 are electrically connected to the source layers in the active area AA through contacts CNTs. The second source lines S2 are formed in a same metallic layer as that of the first source lines S1 and are configured as an integrated wiring layer. Therefore, the source layers are electrically connected to the first source lines S1 through the contacts CNTs and the second source lines S2.

The dummy source lines DS are placed adjacently to both ends of each array of a plurality of the second source lines S2, respectively. That is, the dummy source lines DS are provided at end portions of the relevant first source line S1, respectively. The second source lines S2 are not provided on outer sides of the dummy source lines DS. The dummy source lines DS are connected to the relevant first source line S1 and extend in the Y-direction from the first source line S1 similarly to the second source lines S2. The dummy source lines DS extend in a direction substantially parallel to the second source lines S2. On the other hand, the dummy source lines DS are not electrically connected to lines other than the first source line S1. That is, the dummy source lines DS have no branch lines in the same wiring layer and have no contacts connecting to an upper or lower layer line. Therefore, the dummy source lines DS do not function as source lines. The function of the dummy source lines DS will be described later.

In this way, the second source lines S2 and the dummy source lines DS diverge from the relevant first source line S1 and are configured in the shape of a comb.

The first drain lines D1 are also located above the semiconductor substrate 10 and extend in the X-direction. A plurality of the second drain lines D2 are connected to each of the first drain lines D1 and extend in the Y-direction from the relevant first drain line D1. The second drain lines D2 are electrically connected to the drain layers in the active area AA through contacts CNTd. The second drain lines D2 are formed in a same metallic layer as that of the first drain lines D1 and are configured as an integrated wiring layer. Therefore, the drain layers are electrically connected to the first drain lines D1 through the contacts CNTd and the second drain lines D2.

The dummy drain lines DD are placed adjacently to both ends of each array of a plurality of the second drain lines D2, respectively. That is, the dummy drain lines DD are provided at end portions of the relevant first drain line D1, respectively. The second drain lines D2 are not provided on outer sides of the dummy drain lines DD. The dummy drain lines DD are connected to the relevant first drain line D1 and extend in the Y-direction from the first drain line D1 similarly to the second drain lines D2. The dummy drain lines DD extend in a direction substantially parallel to the second drain lines D2. On the other hand, the dummy drain lines DD are not electrically connected to lines other than the first drain line D1. That is, the dummy drain lines DD have no branch lines in the same wiring layer and have no contacts connecting to an upper or lower layer line. Therefore, the dummy drain lines DD do not function as drain lines. The function of the dummy drain lines DD will be described later.

In this way, the second drain lines D2 and the dummy drain lines DD diverge from the relevant first drain line D1 and are configured in the shape of a comb.

The gate electrodes CG are arranged to extend in the Y-direction between the second source lines S2 and the second drain lines D2. A gate dielectric film (not illustrated) is provided on a channel region between the source layers and the drain layers in the active area AA. The gate electrodes CG are located on the gate dielectric film. The gate electrodes CG are connected to an external circuit via other upper layer lines.

The transistors Tr with the configuration described above have a large channel width and can pass a large current with a low resistance.

Figure 2:
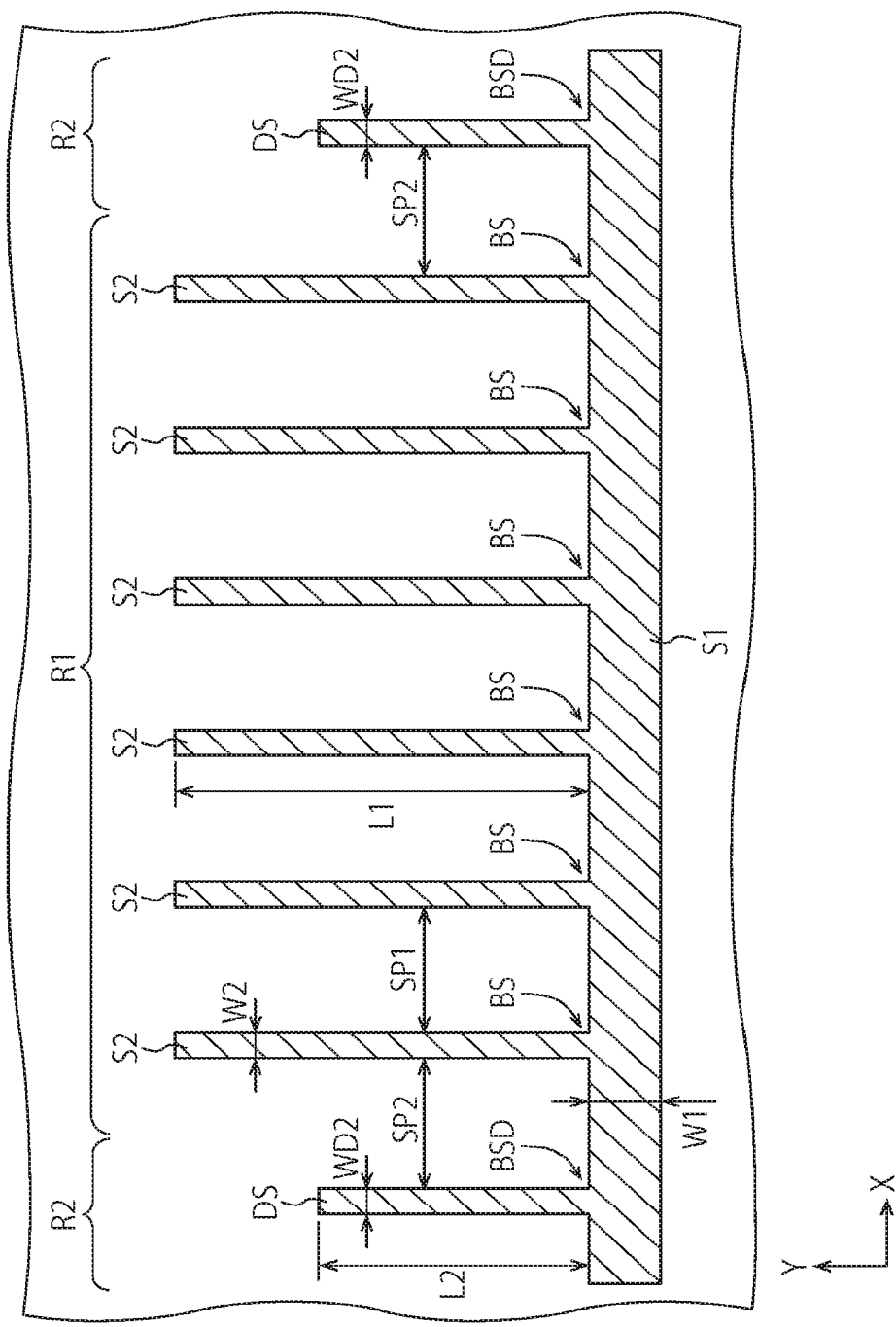
FIG. 2 is a plan view illustrating a configuration example of the source lines and the dummy source lines.

FIG. 2 is a plan view illustrating a configuration example of the source lines S1 and S2 and the dummy source lines DS. The configuration of the drain lines D1 and D2 and the dummy drain lines DD is basically identical to that of the source lines S1 and S2 and the dummy source lines DS and therefore explanations thereof are omitted.

The first source lines S1, the second source lines S2, and the dummy source lines DS are formed by processing a same metallic layer using a lithography technology and an etching technology. For example, copper is used as the first source lines S1, the second source lines S2, and the dummy source lines DS.

A width W2 of the second source lines S2 in a direction (the X-direction) perpendicular to the longitudinal direction (the Y-direction) thereof is smaller than a width W1 of the first source lines S1 in a direction (the Y-direction) perpendicular to the longitudinal direction (the X-direction) thereof. For example, the width W2 is smaller than a third of the width W1. Stress is likely to be applied to branch portions BS between each of the wide first source lines S1 and the relevant narrow second source lines S2 branching off from the first source line S1. For example, when an insulating film (not illustrated) coats the first source lines S1, the second source lines S2, and the dummy source lines DS, stress from the insulating film is likely to be concentrated at the branch portions BS. The insulating film is, for example, a silicon dioxide film or a silicon nitride film.

Meanwhile, copper wires include small vacancies. Therefore, in a case in which the first source lines S1, the second source lines S2, and the dummy source lines DS are made of, for example, copper, the vacancies move in the copper wires to converge on the branch portions BS where the stress is concentrated.

It is preferable that the width of the second source lines S2 be decreased as much as possible to increase the number of the source lines S2 in order to increase the channel width of the transistors Tr. Meanwhile, when the width of the second source lines S2 is decreased, the resistance value is increased and therefore a current flowing in each of the second source lines S2 is reduced. Accordingly, the width and length of the second source lines S2 are determined to enable the transistors Tr to pass a maximum current as a whole, that is, to minimize the on resistance of the transistors Tr. Therefore, the width of the second source lines S2 is smaller than the width of the first source line S1.

Figure 3:
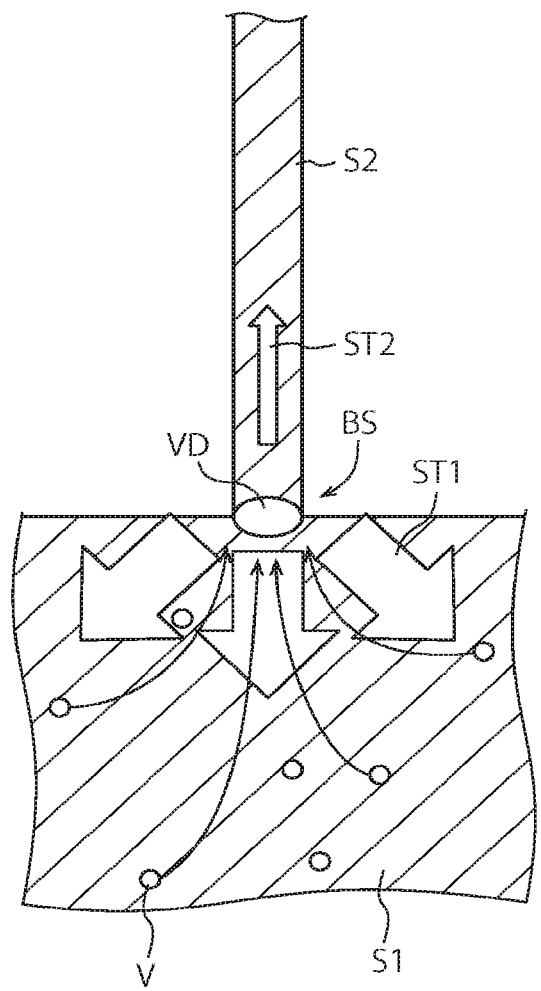
FIG. 3 is a diagram illustrating a manner in which vacancies move to the branch portions.

FIG. 3 is a diagram illustrating a manner in which vacancies V move to the branch portions BS. Because the width W1 of the first source line S1 is sufficiently larger than the width W2 of the second source lines S2, more vacancies V are included in the first source line S1 than in each of the second source lines S2. The vacancies V included in the first source line S1 are likely to be concentrated at portions to which relatively large stress is applied. For example, when an insulating film such as a silicon dioxide film or a silicon nitride film coats the source lines S1 and S2, stress (for example, tensile stress) ST2 is applied to the second source lines S2. In contrast, stress (for example, tensile stress) ST1 larger than the stress ST2 is applied to the first source line S1 wider than the second source line S2. Accordingly, a stress difference between the stress ST1 of the first source line S1 and the stress ST2 of the second source line S2 is applied to the corresponding branch portion BS.

In a case in which stress is uniformly applied to the first and second source lines S1 and S2, the vacancies V are substantially uniformly dispersed and are not locally concentrated. However, if stress is unsymmetrically applied to the first and second source lines S1 and S2, a stress difference is produced between the first source line S1 and each of the second source lines S2. This stress difference is large at the branch portions BS of the first and second source lines S1 and S2. That is, at the branch portions BS, stress is unsymmetrically applied and the stress difference is large.

The vacancies V converge on the branch portions BS where such a large stress difference is produced. If the vacancies V are concentrated at the branch portions BS and become relatively large voids VD, the second source lines S2 have a risk of being disconnected from the first source line S1. Further, the resistance value between the second source lines S2 and the first source line S1 increases. In this case, the resistance between the source and the drain of the transistors Tr increases, which adversely affects electrical characteristics of the transistors Tr.

In a region in which the second source lines S2 are arrayed, the vacancies V are dispersed on the branch portions BS respectively corresponding to the second source lines S2. Therefore, large voids VD are unlikely to be generated in the region in which the second source lines S2 are arrayed. For example, in a region R1 in FIG. 2, the second source lines S2 are regularly and relatively densely arrayed. While being concentrated at the branch portions BS to some extent, the vacancies V are dispersed on the branch portions BS in the region R1, so that the vacancies V are unlikely to be grown to large voids VD.

Meanwhile, at the end portions of each array of the second source lines S2, while being adjacent to other second source lines S2 on one side, endmost second source lines S2 are not adjacent to other second source lines S2 on the other side. Therefore, the vacancies V are likely to be concentrated at endmost branch portions BS and large voids VD are likely to be generated. For example, in a case in which the dummy source lines DS are not provided in regions R2 in FIG. 2, the vacancies V are likely to be concentrated at the branch portions BS of the endmost second source lines S2 and be grown to large voids VD.

In contrast thereto, in the semiconductor device according to the present embodiment, the dummy source lines DS are provided in the regions R2 in FIG. 2. The dummy source lines DS are provided adjacently to the both end portions of each array of the second source lines S2. It is preferable that intervals SP2 between the dummy source lines DS and the endmost second source lines S2 be equal to or smaller than intervals SP1 between adjacent ones of the second source lines S2. This enables the vacancies V on the end portions of the first source line S1 to be dispersed on the dummy source lines DS and the endmost second source lines S2. That is, the vacancies V move not only to the endmost branch portions BS but also to branch portions BSD of the dummy source lines DS adjacent thereto. Accordingly, formation of large voids VD on the end most branch portions BS can be suppressed.

Further, with the provision of the dummy source lines DS, stress on the end portions of each array of the second source lines S2 is substantially symmetrically applied. Increase in the symmetric property of the stress can reduce concentration of the vacancies V at the endmost branch portions BS.

As described above, according to the present embodiment, local concentration of the vacancies V in the first source lines S1 at the end portions of each array of the second source lines S2 can be reduced. As a result, reliability of the semiconductor device is enhanced.

The intervals SP2 may be larger than the intervals SP1. In this case, the effect of the present embodiment can still be achieved while the effect of the present embodiment is decreased.

A length L2 of the dummy source lines DS in the longitudinal direction is larger than the width W2. For example, the length L2 of the dummy source lines D2 is equal to or more than 2 micrometers. Meanwhile, the length L2 of the dummy source lines DS is same as a length L1 of the second source lines S2 in the longitudinal direction or shorter than the length L1. With the length L2 of the dummy source lines DS same as the length L1 of the second source lines S2, the symmetric property of stress at the end portions of each array of the second source lines S2 is improved more. With the length L2 of the dummy source lines DS shorter than the length L1 of the second source lines S2, the layout area of the transistors Tr can be reduced. Therefore, it is preferable that the length L2 of the dummy source lines DS be not smaller than 2 micrometers and not larger than the length L1. In a case in which the length L2 of the dummy source lines DS is smaller than 2 micrometers, stress from the insulating film is unlikely to be applied to the dummy source lines DS and the vacancies V are unlikely to be concentrated at the branch portions BSD. On the other hand, if the length L2 of the dummy source lines DS is larger than the length L1 of the second source lines S2, the layout area of the dummy source lines DS is increased more and the circuit scale becomes excessively large. The dummy source lines DS have no electrical function and are provided to disperse the vacancies V. In view of this function, it is preferable that the size of the dummy source lines DS be as small as possible. That is, it is preferable that the dummy source lines DS have a length subjected to stress from the insulating film to enhance the symmetry property and be as small as possible to reduce the circuit scale. The length L1 of the second source lines S2 in the longitudinal direction is also equal to or more than 2 micrometers. However, the length L1 may be different among the second source lines S2.

Further, a width WD2 of the dummy source lines DS in a direction perpendicular to the longitudinal direction thereof can be similar to the width W2 of the second source lines S2. For example, the width WD2 of the dummy source lines DS and the width W2 of the second source lines S2 are equal to or less than 500 nanometers. Accordingly, the dummy source lines DS are elongated in the Y-direction and can be sufficiently subjected to the stress from the insulating film.

The intervals SP2 between the dummy source lines DS and the endmost second source lines S2 are equal to or less than 500 nanometers, which is equal to or less than 500 nanometers being the intervals SP1 between adjacent ones of the second source lines S2. However, the intervals SP1 may be different from each other as long as the intervals SP1 are equal to or less than 500 nanometers. In this manner, due to narrowing the intervals SP1 and SP2 to some extent and continuously arranging the second source lines S2 and the dummy source lines DS at relatively narrow intervals, the vacancies V are dispersed on many branch portions BS and BSD. Therefore, the quantity of the vacancies V concentrated at the branch portions BS and BSD is decreased and also the voids VD can be reduced in the size.

The configurations and effects described above are similarly applied to the first and second drain lines D1 and D2, and the dummy drain lines DD.

Second Embodiment

Figure 4:
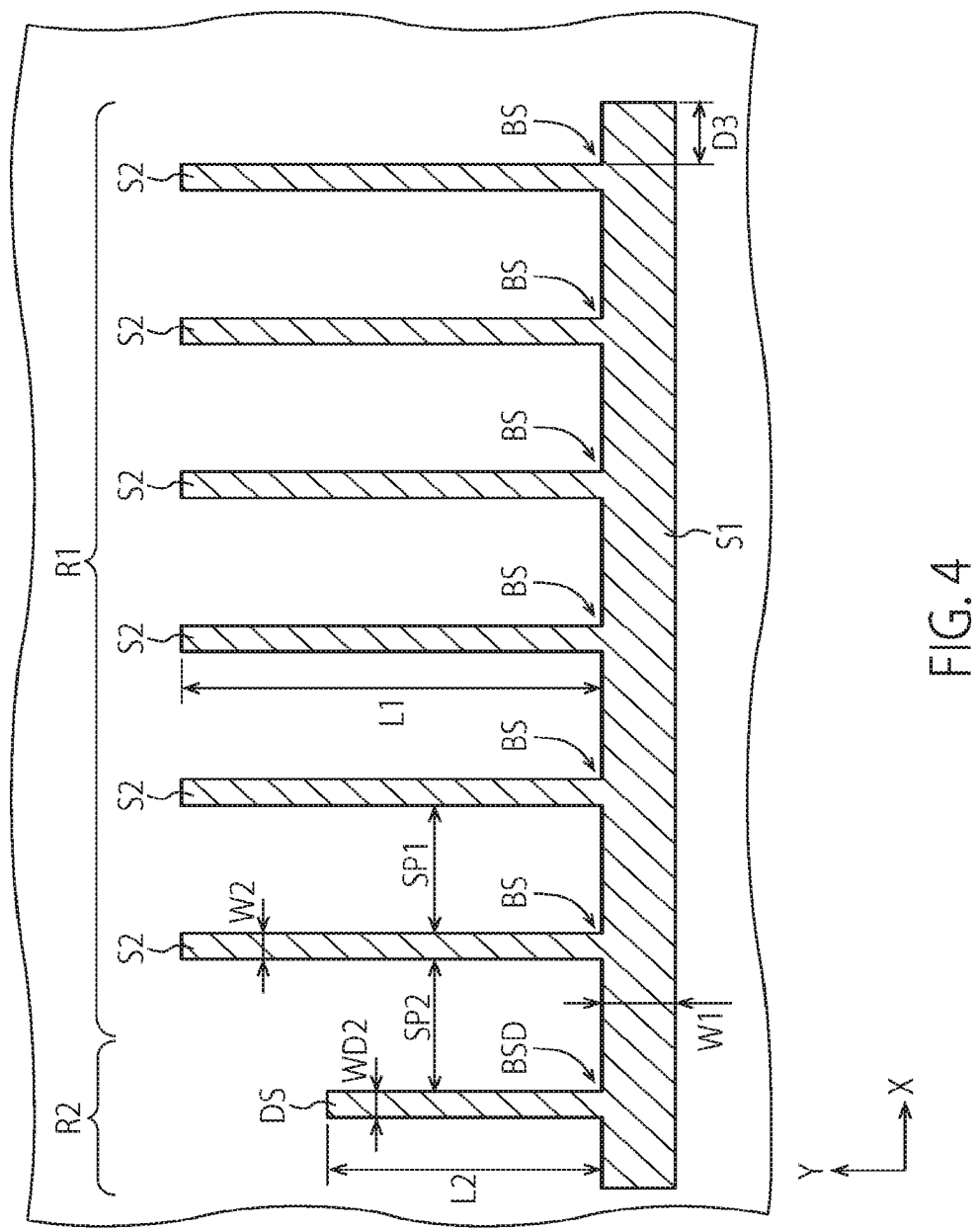
FIG. 4 is a plan view illustrating source lines or drain lines of a semiconductor device according to a second embodiment.

FIG. 4 is a plan view illustrating source lines or drain lines of a semiconductor device according to a second embodiment. The source lines S1 and S2 and the dummy source lines DS are explained below and explanations of the drain lines D1 and D2 and the dummy drain lines DD are omitted.

In the first embodiment, the dummy source lines DS are provided on the both sides of each array of the second source lines S2. In contrast, the dummy source lines DS are provided only on one side of each array of the second source lines S2 in the second embodiment.

For example, in a case in which a distance D3 from an endmost second source line S2 to one end of the first source line S1 is relatively short (for example, equal to or less than 500 nanometers) as illustrated in FIG. 4, no dummy source line DS is provided. The reason is that the number of vacancies V included in the end portion of the first source line S1 is small because the distance D3 is short. When the number of vacancies V is small, the vacancies V cannot become large voids VD even if the vacancies V are concentrated. Therefore, in the case in which the distance D3 is relatively short, it is unnecessary to provide the dummy source line DS. It is assumed here that the densities of vacancies V included in the copper material of the first and second source lines S1 and S2 are equal.

In this case, it suffices that the dummy source line DS is provided only on the other end of the first source line S1. That is, the dummy source line DS is provided only at one end of each array of the second source lines S2 in some cases. The dummy source line DS is provided adjacently to the endmost second source line S2 at the other end portion of the first source line S1. Other configurations of the second embodiment may be identical to corresponding ones of the first embodiment.

The configurations and effects described above are similarly applied to the first and second drain lines D1 and D2, and the dummy drain lines DD.

(Modification)

Figure 5:
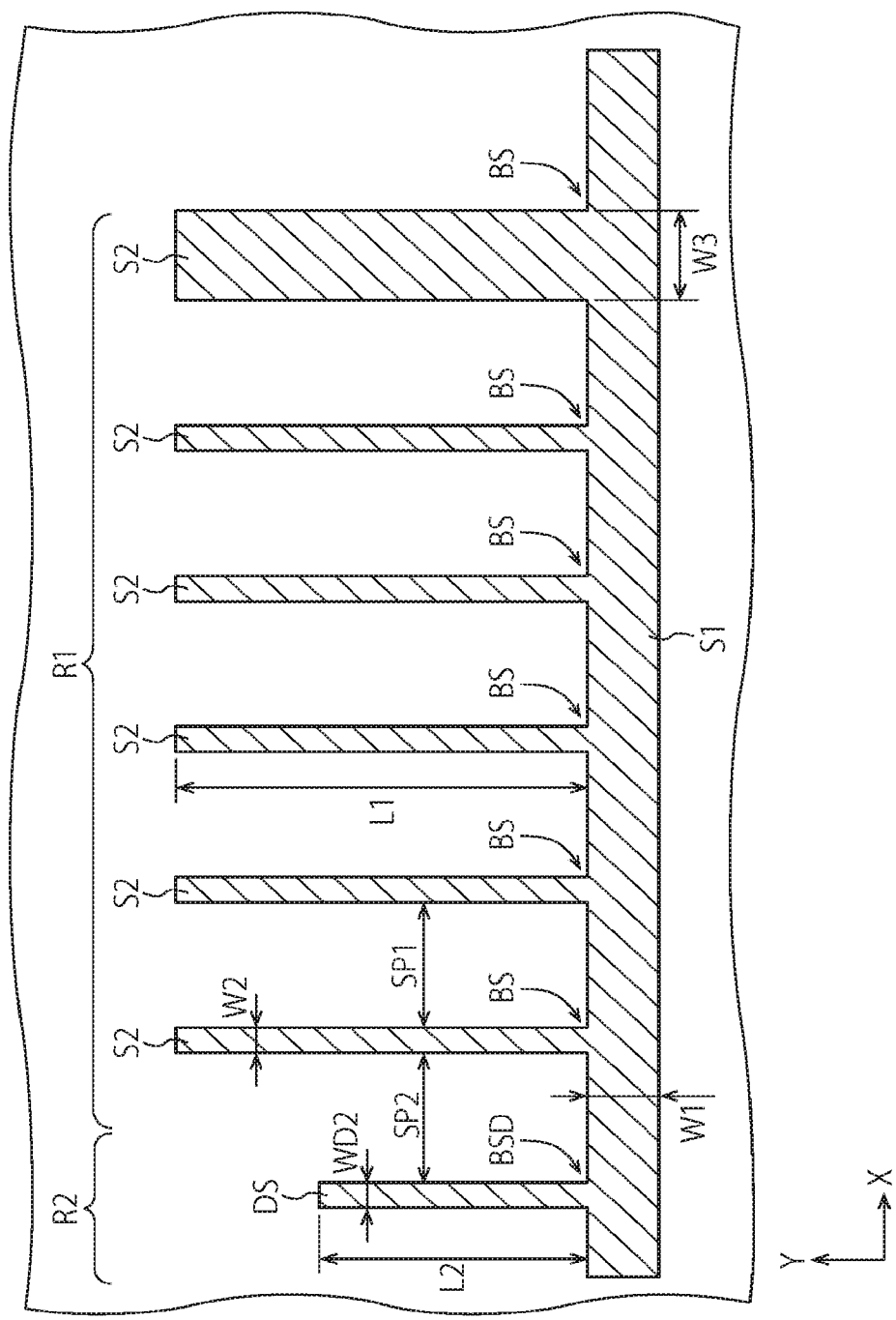
FIG. 5 is a plan view illustrating source lines or drain lines of a semiconductor device according to a modification of the second embodiment.

FIG. 5 is a plan view illustrating source lines or drain lines of a semiconductor device according to a modification of the second embodiment. The source lines S1 and S2 and the dummy source lines DS are explained below and explanations of the drain lines D1 and D2 and the dummy drain lines DD are omitted.

The modification is identical to the second embodiment in that the dummy source line DS is provided only on one side of each array of the second source lines S2. However, a width W3 of the endmost second source line S2 located at one end of the first source line S1 is larger than the width W2 of other second source lines S2 in the modification.

For example, the width W3 of the endmost second source line S2 is larger than the width W2 of other second source lines S2 as illustrated in FIG. 5. Accordingly, even if the vacancies V are concentrated at the branch portion BS of the endmost second source line S2, there is a small risk of line breaking and the reliability control is not affected so much. Therefore, in the case in which the width 3 of the endmost second source line S2 is large, it is unnecessary to provide the dummy source line DS.

In this case, it suffices that the dummy source line DS is provided only on the other end of the first source line S1. That is, the dummy source line DS is provided only at one end of each array of the second source lines S2 in some cases. The dummy source line DS is provided adjacently to the endmost second source line S2 at the other end portion of the first source line S1. Other configurations of the modification may be identical to corresponding ones of the second embodiment.

While certain embodiments have been described, these embodiments have been presented by way of example only, and are not intended to limit the scope of the inventions. Indeed, the novel methods and systems described herein may be embodied in a variety of other forms; furthermore, various omissions, substitutions and changes in the form of the methods and systems described herein may be made without departing from the spirit of the inventions. The accompanying claims and their equivalents are intended to cover such forms or modifications as would fall within the scope and spirit of the inventions.

The invention claimed is:

1. A semiconductor device comprising:
a first metallic line provided above a substrate and extending in a first direction with a first width in a plan view of the device;
at least one second metallic line directly connected to the first metallic line and extending in a second direction from the first metallic line with a second width that is smaller than the first width in the plan view; and
a dummy metallic line arranged adjacently to the at least one second metallic line in the plan view, directly connected to the first metallic line, and extending in the second direction from the first metallic line in the plan view while not electrically connected to lines other than the first metallic line.

2. The device of claim 1, wherein copper is used as the first and second metallic lines and the dummy metallic line.

3. The device of claim 1, wherein
a plurality of the second metallic lines are arrayed on the first metallic line, and
the dummy metallic line is adjacent to at least one end of the arrayed second metallic lines.

4. The device of claim 2, wherein
a plurality of the second metallic lines are arrayed on the first metallic line, and
the dummy metallic line is adjacent to at least one end of the arrayed second metallic lines.

5. The device of claim 1, wherein the dummy metallic line is adjacent to both ends of the arrayed second metallic lines.

6. The device of claim 2, wherein the dummy metallic line is adjacent to both ends of the arrayed second metallic lines.

7. The device of claim 1, wherein a width of the dummy metallic line in a direction perpendicular to a longitudinal direction of the dummy metallic line is smaller than a third of a width of the first metallic line in a direction perpendicular to a longitudinal direction of the first metallic line.

8. The device of claim 2, wherein a width of the dummy metallic line in a direction perpendicular to a longitudinal direction of the dummy metallic line is smaller than a third of a width of the first metallic line in a direction perpendicular to a longitudinal direction of the first metallic line.

9. The device of claim 3, wherein a width of the dummy metallic line in a direction perpendicular to a longitudinal direction of the dummy metallic line is smaller than a third of a width of the first metallic line in a direction perpendicular to a longitudinal direction of the first metallic line.

10. The device of claim 1, wherein a length of the dummy metallic line in a longitudinal direction thereof is larger than a width of the dummy metallic line.

11. The device of claim 2, wherein a length of the dummy metallic line in a longitudinal direction thereof is larger than a width of the dummy metallic line.

12. The device of claim 3, wherein a length of the dummy metallic line in a longitudinal direction thereof is larger than a width of the dummy metallic line.

13. The device of claim 1, wherein an interval between the second metallic line and the dummy metallic line is equal to or less than 500 nanometers.

14. The device of claim 1, wherein the width of the second metallic line and a width of the dummy metallic line are equal to or less than 500 nanometers.

15. The device of claim 1, wherein a length of the dummy metallic line in a longitudinal direction thereof is equal to or more than 2 micrometers.

16. The device of claim 1, wherein a length of the dummy metallic line in a longitudinal direction thereof is equal to or less than a length of the second metallic line in a longitudinal direction thereof.

17. The device of claim 2, wherein a length of the dummy metallic line in a longitudinal direction thereof is equal to or less than a length of the second metallic line in a longitudinal direction thereof.

18. The device of claim 3, wherein a length of the dummy metallic line in a longitudinal direction thereof is equal to or less than a length of the second metallic line in a longitudinal direction thereof.

19. A semiconductor device comprising:
a first metallic line provided above a substrate and extending in a first direction with a first width in a plan view of the device;
a plurality of second metallic lines directly connected to the first metallic line and extending in a second direction from the first metallic line with a second width that is smaller than the first width in the plan view; and
a dummy metallic line arranged adjacently to one side of an array of the second metallic lines in the plan view, directly connected to the first metallic line, and extending in the second direction from the first metallic line in the plan view while not electrically connected to lines other than the first metallic line.

20. A semiconductor device comprising:
a first metallic line provided above a substrate and extending in a first direction with a first width in a plan view of the device;
a plurality of second metallic lines directly connected to the first metallic line and extending in a second direction from the first metallic line with a second width that is smaller than the first width in the plan view; and
a dummy metallic line arranged adjacently to an array of the second metallic lines in the plan view, directly connected to the first metallic line, and extending in the second direction from the first metallic line in the plan view while not electrically connected to lines other than the first metallic line, wherein
a width of one of the second metallic lines located at one end of the array of the second metallic line is larger than that of other second metallic lines in the plan view.

* * * * *